United States Patent
Park

(10) Patent No.: US 8,854,910 B2
(45) Date of Patent: Oct. 7, 2014

(54) SEMICONDUCTOR MEMORY DEVICE AND REFRESH METHOD THEREOF

(75) Inventor: Nak Kyu Park, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 343 days.

(21) Appl. No.: 13/450,797

(22) Filed: Apr. 19, 2012

(65) Prior Publication Data

US 2013/0051157 A1    Feb. 28, 2013

(30) Foreign Application Priority Data

Aug. 30, 2011  (KR) .................. 10-2011-0087416

(51) Int. Cl.
*G11C 7/00* (2006.01)
*G11C 11/406* (2006.01)

(52) U.S. Cl.
CPC .... *G11C 11/40615* (2013.01); *G11C 11/40622* (2013.01)
USPC ...................... 365/222; 365/230.03

(58) Field of Classification Search
USPC ........................... 365/222, 230.03
See application file for complete search history.

(56) References Cited

U.S. PATENT DOCUMENTS

2010/0262769 A1 *  10/2010  Janzen ................ 711/106
2012/0051168 A1 *   3/2012  Song .................. 365/222

FOREIGN PATENT DOCUMENTS

KR    10-0608370 B1    8/2006

* cited by examiner

*Primary Examiner* — Vu Le

(74) *Attorney, Agent, or Firm* — William Park & Associates Patent Ltd.

(57) ABSTRACT

A semiconductor memory device includes a memory core configured to sequentially activate first and second banks in response to first and second bank active signals which are sequentially enabled in response to first and second enable signals when a self-refresh operation is to be performed, select a word line by row addresses, and perform a refresh operation for memory cells which are connected with the word line; and an address counter configured to perform a counting operation for the row addresses in response to a counter signal, and interrupt the counting operation for the row addresses in a case where both the first and second banks are not activated when the self-refresh operation is ended.

21 Claims, 6 Drawing Sheets

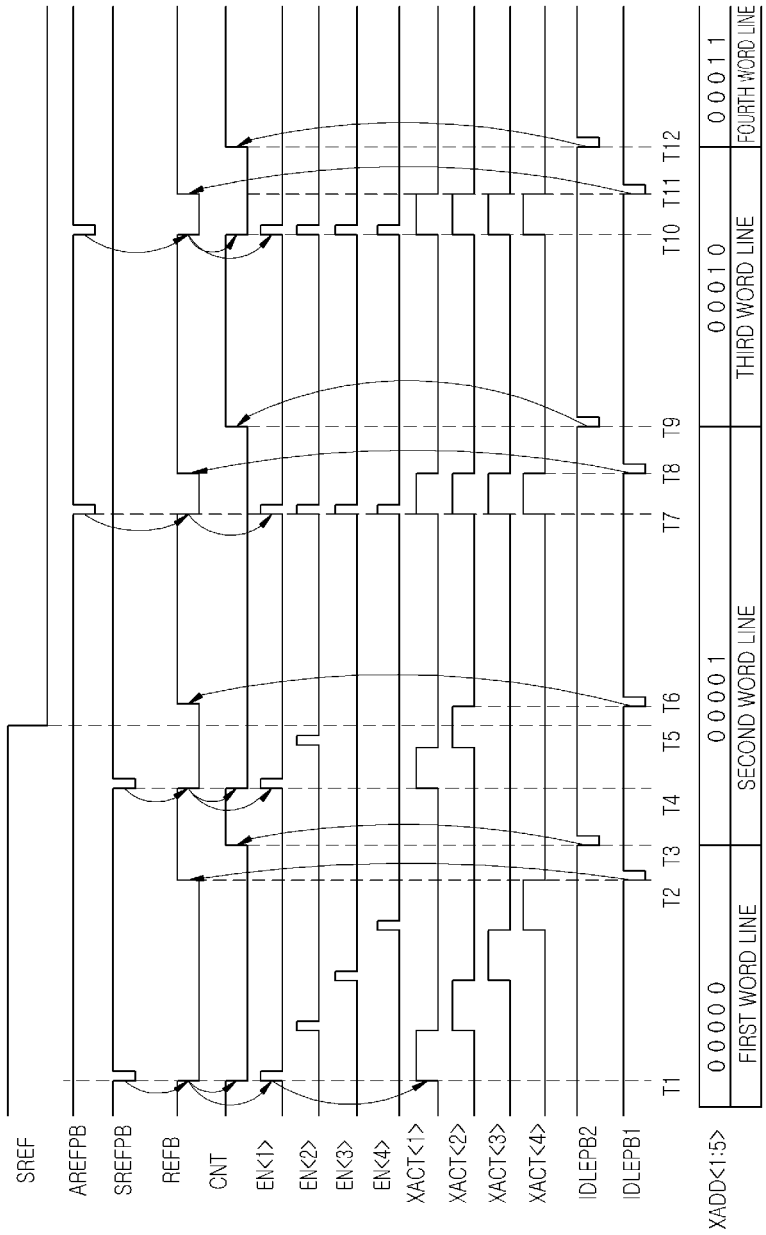

SEMICONDUCTOR MEMORY DEVICE AND REFRESH METHOD THEREOF

CROSS-REFERENCES TO RELATED APPLICATIONS

The present application claims priority under 35 U.S.C. 119(a) to Korean Application No. 10-2011-0087416, filed on Aug. 30, 2011, in the Korean Intellectual Property Office, which is incorporated herein by reference in its entirety set forth in full.

BACKGROUND

Example embodiments of the present invention relate to a semiconductor memory device and a refresh method thereof, which can reduce current consumption when performing a self-refresh operation.

Recently, as demand for mobile products such as mobile phones and PDAs (personal digital assistant) abruptly increases, efforts have been made to reduce current consumption of DRAM (dynamic random access memory) mounted in these mobile products.

In a DRAM, unlike an SRAM (static random access memory) or a flash memory, a phenomenon occurs in which the data stored in a memory cell disappears with a lapse of time. In order to prevent an occurrence of such a phenomenon, an operation for recovering the data stored in a memory cell from an outside source every preset cycle is needed. Such an operation is called a refresh operation. Refresh is implemented in such a way as to sense and amplify data by selecting a word line for refreshing at least one time within a retention time of memory cells arranged in a bank. The retention time means a time for which data can be retained in a cell without performing refresh after the data is stored in the cell.

Refresh is divided into an auto-refresh which is performed in a normal mode and a self-refresh which is performed in a power-down mode. In general, since the self-refresh is performed in the power-down mode, it has a longer cycle than the auto-refresh.

FIG. 1 is a block diagram illustrating a configuration of a conventional semiconductor memory device.

The conventional semiconductor memory device includes a command decoder 11, a self-refresh pulse generation unit 12, an access signal generation unit 13, and a memory core 14.

The command decoder 11 decodes a command signal CMD and a clock enable signal CKE and generates a self-refresh signal SREF and an auto-refresh pulse AREFPB. The command signal CMD includes a chip selection signal (/CS), a RAS signal (/RAS), a CAS signal (/CAS) and a write enable signal (/WE). The command decoder 11 decodes the chip selection signal (/CS), the RAS signal (/RAS), the CAS signal (/CAS) and the write enable signal (/WE) and generates the self-refresh signal SREF before toggling of a clock (CLK) is stopped after the clock enable signal CKE is disabled. The self-refresh signal SREF is enabled to a logic high level when performing a self-refresh operation. The auto-refresh pulse AREFPB includes a pulse which is cyclically generated when performing an auto-refresh operation.

The self-refresh pulse generation unit 12 generates a self-refresh pulse SREFPB in response to the self-refresh signal SREF. The self-refresh pulse SREFPB includes a pulse which is cyclically generated when performing the self-refresh operation.

The access signal generation unit 13 counts row addresses XADD<1:5> one bit by one bit and outputs the counted bits of the row addresses XADD<1:5> to the memory core 14.

Also, the access signal generation unit 13 outputs first to fourth bank active signals XACT<1:4> simultaneously to the memory core 14 in response to the self-refresh pulse SREFPB when performing the self-refresh operation, and outputs the first to fourth bank active signals XACT<1:4> simultaneously to the memory core 14 in response to the auto-refresh pulse AREFPB when performing the auto-refresh operation.

The memory core 14 includes first to fourth banks 141 to 144. The memory core 14 selects a word line by the row addresses XADD<1:5> while simultaneously activating the first to fourth banks 141 to 144 by the first to fourth bank active signals XACT<1:4> and performs a refresh operation for the memory cells connected with a word line.

Current consumption increases in the conventional semiconductor memory device because, the word line is selected by the row addresses XADD<1:5> while simultaneously activating the first to fourth banks 141 to 144; and the refresh operation is performed for the memory cells connected with the word line when performing not only the auto-refresh operation but also the self-refresh operation with a longer refresh cycle.

SUMMARY

Embodiments of the present invention are directed to a semiconductor memory device and a refresh method thereof, in which a word line is selected by row addresses while sequentially activating banks when performing a self-refresh operation and the self-refresh operation is performed for the memory cells connected with the word line, whereby it is possible to reduce current consumption. Further, embodiments of the present invention are directed to a semiconductor memory device and a refresh method thereof, wherein, in the case where a self-refresh operation is interrupted while a certain word line is selected while sequentially activating banks and the self-refresh operation is performed for the memory cells connected with the word line, the information of the certain word line is stored and an auto-refresh operation is performed from the certain word line in a normal mode, whereby it is possible to perform the refresh operations without omission of a word line.

In one embodiment, a semiconductor memory device includes: a memory core configured to sequentially activate first and second banks in response to first and second bank active signals which are sequentially enabled in response to first and second enable signals when a self-refresh operation is to be performed, select a word line by row addresses, and perform a refresh operation for memory cells which are connected with the word line; and an address counter configured to perform a counting operation for the row addresses in response to a counter signal, and interrupt the counting operation for the row addresses in a case where both the first and second banks are not activated when the self-refresh operation is ended.

In another embodiment, a refresh method of a semiconductor memory device, comprising: performing a self-refresh operation by sequentially activating first and second banks; and performing an auto-refresh operation by simultaneously activating the first and second banks.

BRIEF DESCRIPTION OF THE DRAWINGS

The above and other aspects, features and other advantages will be more clearly understood from the following detailed description taken in conjunction with the accompanying drawings, in which:

FIG. 7 is a timing diagram explaining operations of the semiconductor memory device in accordance with an embodiment of the present invention.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
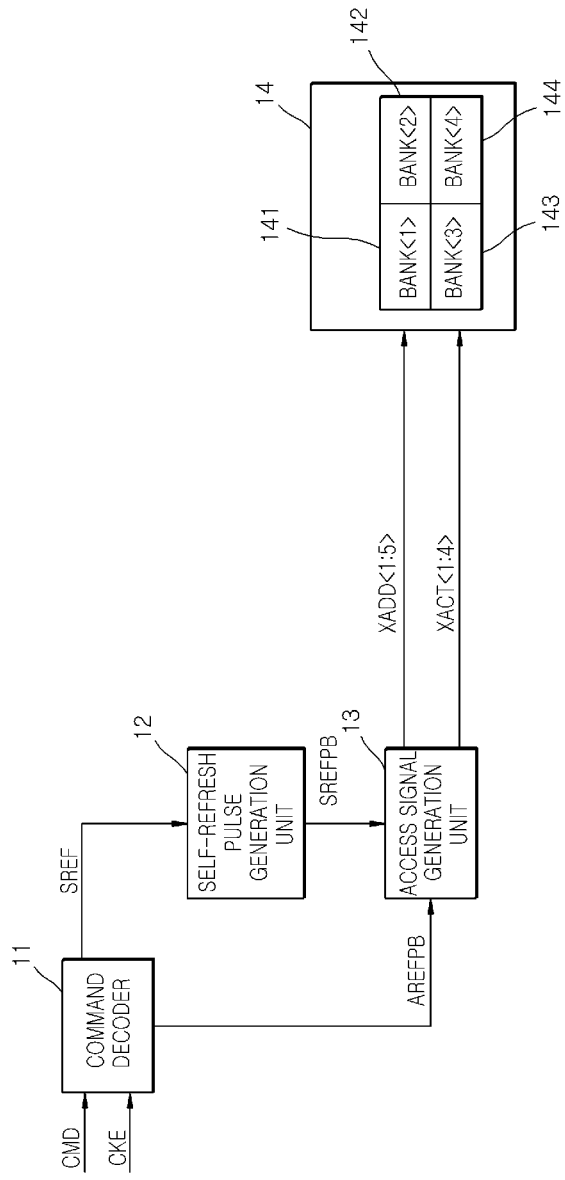
FIG. 1 is a block diagram illustrating a configuration of a conventional semiconductor memory device.
Figure 2:
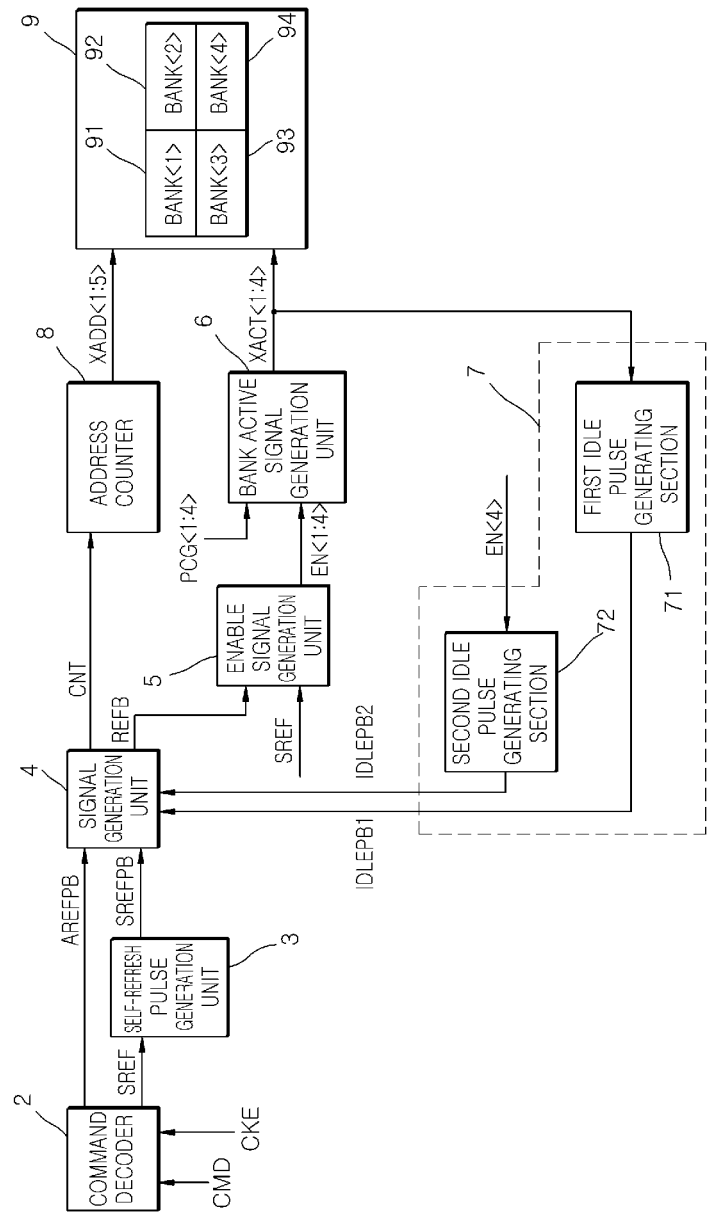
FIG. 2 is a block diagram illustrating a configuration of a semiconductor memory device in accordance with an embodiment of the present invention.

FIG. 2 is a block diagram illustrating the configuration of a semiconductor memory device in accordance with an embodiment of the present invention.

Referring to FIG. 2, the semiconductor memory device in accordance with an embodiment of the present invention includes a command decoder 2, a self-refresh pulse generation unit 3, a signal generation unit 4, an enable signal generation unit 5, a bank active signal generation unit 6, an idle pulse generation unit 7, an address counter 8, and a memory core 9. The idle pulse generation unit 7 includes a first idle pulse generating section 71 and a second idle pulse generating section 72. The memory core 9 includes first to fourth banks 91 to 94.

The command decoder 2 is configured to decode a command signal CMD and a clock enable signal CKE and generates a self-refresh signal SREF and an auto-refresh pulse AREFPB. The self-refresh pulse generation unit 3 is configured to generate a self-refresh pulse SREFPB in response to the self-refresh signal SREF. The self-refresh signal SREF is enabled to a logic high level when performing a self-refresh operation. The self-refresh pulse SREFPB includes a pulse which is cyclically generated when performing the self-refresh operation. The auto-refresh pulse AREFPB includes a pulse which is cyclically generated when performing an auto-refresh operation. The signal generation unit 4 is configured to generate a refresh signal REFB and a counter signal CNT in response to the self-refresh pulse SREFPB when performing the self-refresh operation, and generate the refresh signal REFB and the counter signal CNT in response to the auto-refresh pulse AREFPB when performing the auto-refresh operation. The enable signal generation unit 5 is configured to sequentially generate first to fourth enable signals EN<1:4> in response to the refresh signal REFB and the self-refresh signal SREF when performing the self-refresh operation, and simultaneously generate the first to fourth enable signals EN<1:4> in response to the refresh signal REFB and the self-refresh signal SREF when performing the auto-refresh operation. The bank active signal generation unit 6 is configured to generate first to fourth bank active signals XACT<1:4> which are enabled in response to the first to fourth enable signals EN<1:4> and are disabled in response to first to fourth precharge signals PCG<1:4>. The idle pulse generation unit 7 is configured to generate a first idle pulse IDLEPB1 at a time when all the first to fourth bank active signals XACT<1:4> are disabled and generate a second idle pulse IDLEPB2 after a predetermined period elapses from a time when the fourth enable signal EN<4> is enabled. The refresh signal REFB is disabled in response to the first idle pulse IDLEPB1, and the counter signal CNT is disabled in response to the second idle pulse IDLEPB2. The address counter 8 is configured to count row addresses XADD<1:5> one bit at a time when the counter signal CNT is disabled and output counted bits of the row addresses XADD<1:5> to the memory core 9. The memory core 9 is configured to activate the first to fourth banks 91 to 94 by the first to fourth bank active signals XACT<1:4>, select a word line by the row addresses XADD<1:5> and perform a refresh operation for the memory cells connected with the word line.

Figure 3:
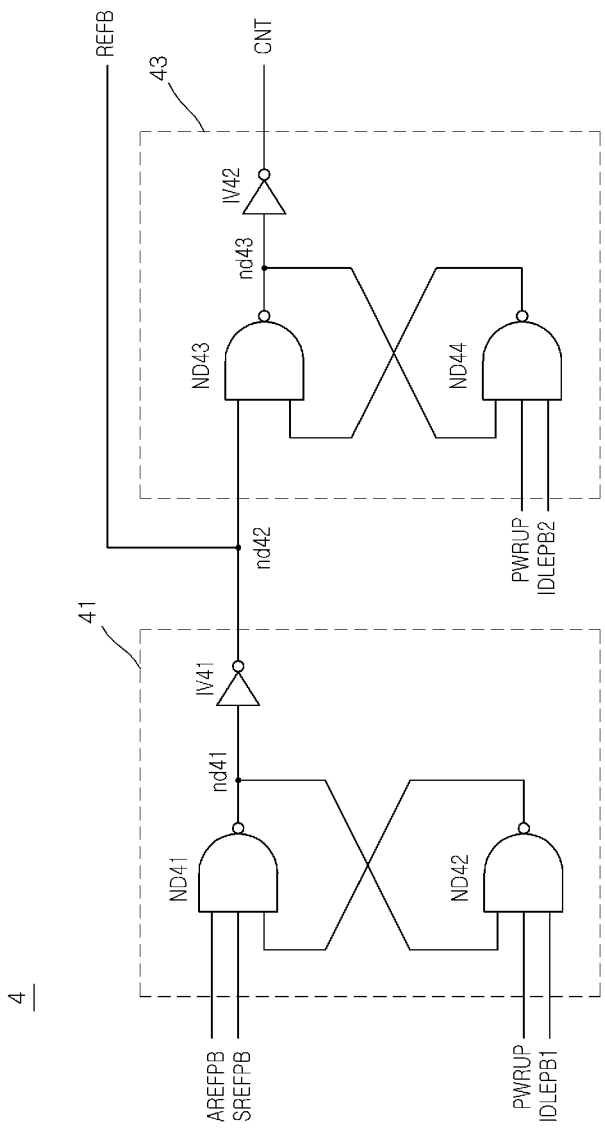
FIG. 3 is a circuit diagram of a signal generation unit included in the semiconductor memory device shown in FIG. 2.

Referring to FIG. 3, the signal generation unit 4 includes a first latch section 41 and a second latch section 43.

The first latch section 41 includes an SR latch constituted by two NAND gates ND41 and ND42 and an inverter IV41. The first latch section 41 is configured to receive the self-refresh pulse SREFPB as a set signal when the self-refresh operation is to be performed, receive the auto-refresh pulse AREFPB as a set signal when the auto-refresh operation is to be performed, receive a power-up signal PWRUP or the first idle pulse IDLEPB1 as a reset signal, and generate the signal of a node nd41. The inverter IV41 inversion-buffers the signal of the node nd41 and generates the refresh signal REFB as the signal of a node nd42. The refresh signal REFB is enabled when the self-refresh pulse SREFPB or the auto-refresh pulse AREFPB is enabled and the refresh signal REFB is disabled when the power-up signal PWRUP or the first idle pulse IDLEPB1 is enabled. The power-up signal PWRUP is enabled when an external voltage reaches a predetermined level.

The second latch section 43 includes an SR latch constituted by two NAND gates ND43 and ND44 and an inverter IV42. The second latch section 43 is configured to receive the refresh signal REFB as a set signal and the power-up signal PWRUP or the second idle pulse IDLEPB2 as a reset signal, and generate the signal of a node nd43. The inverter IV42 inversion-buffers the signal of the node nd43 and generates the counter signal CNT. The counter signal CNT is enabled when the refresh signal REFB is enabled and the counter signal CNT is disabled when the power-up signal PWRUP or the second idle pulse IDLEPB2 is enabled.

The signal generation unit 4 configured as described above generates the refresh signal REFB and the counter signal CNT in response to the self-refresh pulse SREFPB when the self-refresh operation is to be performed, and the signal generation unit 4 configured as described above generates the refresh signal REFB and the counter signal CNT in response to the auto-refresh pulse AREFPB when the auto-refresh operation is to be performed.

Figure 4:
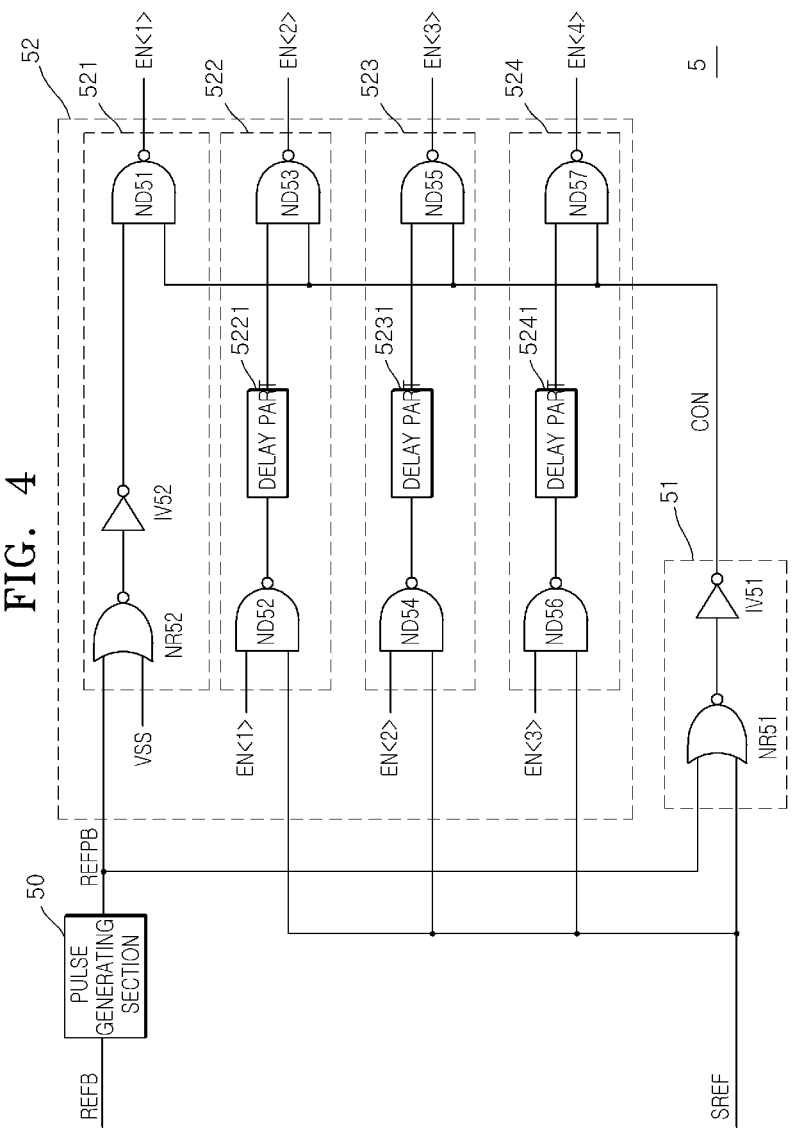
FIG. 4 is a circuit diagram of an enable signal generation unit included in the semiconductor memory device shown in FIG. 2.

Referring to FIG. 4, the enable signal generation unit 5 includes a pulse generating section 50, a control signal generating section 51, and a signal output section 52.

The pulse generating section 50 is configured to generate a refresh pulse REFPB in response to the refresh signal REFB.

The control signal generating section 51 is configured to generate a control signal CON with a logic high level during a period in which the self-refresh signal SREF is enabled to the logic high level, that is, when performing the self-refresh operation, and buffer the refresh pulse REFPB and generate the control signal CON during a period in which the self-refresh signal SREF is disabled to the logic low level, that is, when performing the auto-refresh operation.

The output section 52 includes a first output stage 521, a second output stage 522, a third output stage 523 and a fourth output stage 524. The first output stage 521 includes a NOR gate NR52, an inverter IV52 and a NAND gate ND51, and is configured to buffer the refresh pulse REFPB, and the first output stage 521 generates the first enable signal EN<1>. The second output stage 522 includes a NAND gate ND52, a delay part 5221 and a NAND gate ND53, and is configured to delay the first enable signal EN<1> by a predefined period during in which the self-refresh signal SREF is enabled to the logic high level, and The second output stage 522 generates the second enable signal EN<2>. The third output stage 523 includes a NAND gate ND54, a delay part 5231 and a NAND gate ND55, and is configured to delay the second enable signal EN<2> by the predefined period during the period in which the self-refresh signal SREF is enabled to the logic high level and the third output stage generates the third enable signal EN<3>. The fourth output stage 524 includes a NAND gate ND56, a delay part 5241 and a NAND gate ND57, and is configured to delay the third enable signal EN<3> by the predefined period during in which the self-refresh signal SREF is enabled to the logic high level, and the fourth output stage 524 generates the fourth enable signal EN<4>.

The enable signal generation unit 5 configured as described above sequentially generates the first to fourth enable signals EN<1:4> when the self-refresh operation is to be performed and simultaneously generates the first to fourth enable signals EN<1:4> when the auto-refresh operation is to be performed, in response to the refresh signal REFB and the self-refresh signal SREF.

Figure 5:
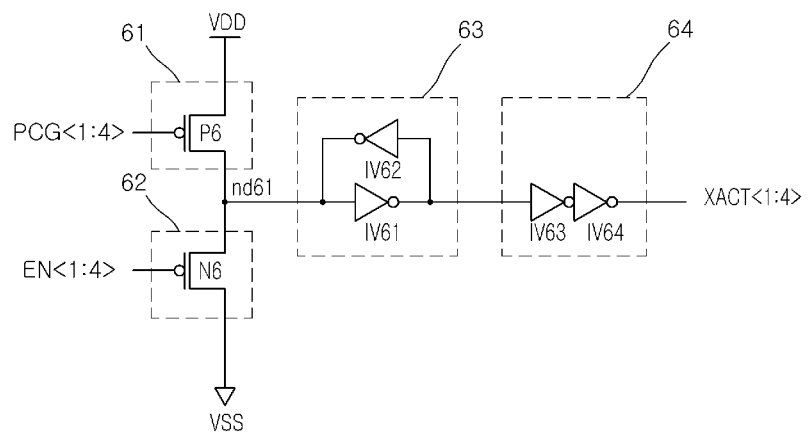
FIG. 5 is a circuit diagram of a bank active signal generation unit included in the semiconductor memory device shown in FIG. 2.

Referring to FIG. 5, the bank active signal generation unit 6 includes a pull-up driving section 61, a pull-down driving section 62, a latch section 63, and a buffer section 64. The pull-up driving section 61 includes a PMOS transistor P6 and is configured to pull-up drive a node nd61 by the first to fourth precharge signals PCG<1:4> of logic low levels. The pull-down driving section 62 includes an NMOS transistor N6 and is configured to pull-down drive the node nd61 by the first to fourth enable signals EN<1:4> of logic high levels. The latch section 63 includes two inverters IV61 and IV62 and is configured to latch the signal of the node nd61. The buffer section 64 includes two inverters IV63 and IV64 and is configured to buffer the output signal of the latch section 63. The first to fourth precharge signals PCG<1:4> are signals which are enabled to logic low levels when the first to fourth banks 91 to 94 perform precharge operations, respectively.

The bank active signal generation unit 6 configured as described above generates the first to fourth bank active signals XACT<1:4> which are enabled in response to the first to fourth enable signals EN<1:4> and are disabled in response to the first to fourth precharge signals PCG<1:4>.

As explained in relation to FIG. 2, the idle pulse generation unit 7 includes the first idle pulse generating section 71 and the second idle pulse generating section 72.

Figure 6:
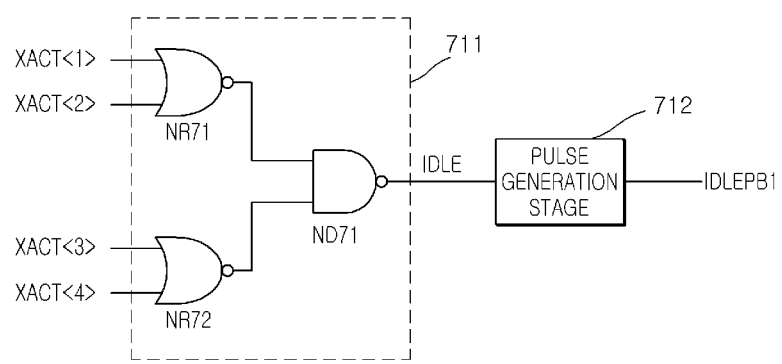
FIG. 6 is a circuit diagram of a first idle pulse generating section included in the semiconductor memory device shown in FIG. 2.

Referring to FIG. 6, the first idle pulse generating section 71 includes an idle signal generation stage 711 and a pulse generation stage 712. The idle signal generation stage 711 includes two NOR gates NR71 and NR72 and one NAND gate ND71, and the idle signal generation stage 711 is configured to generate an idle signal IDLE which is enabled to a logic low level at a time when all the first to fourth bank active signals XACT<1:4> are disabled. The pulse generation stage 712 is configured to generate the first idle pulse IDLEPB1 in response to the idle signal IDLE. The first idle pulse generating section 71 configured in this way generates the first idle pulse IDLEPB1 at the time when all the first to fourth bank active signals XACT<1:4> are disabled.

The second idle pulse generating section 72 may be realized by a pulse generation circuit which is generally known in the art. The second idle pulse generating section 72 is configured to generate the second idle pulse IDLEPB2 after the predetermined period elapses from the time when the fourth enable signal EN<4> is enabled. The predetermined period may be longer than the enable period of the fourth bank active signal XACT<4>. Also, the second idle pulse generating section 72 may generate the second idle pulse IDLEPB2 after the first idle pulse IDLEPB1 is generated. This is to prevent the row addresses XADD<1:5> from being counted in response to the second idle pulse IDLEPB2 before the fourth bank 94 is activated. If the second idle pulse IDLEPB2 is enabled, the counter signal CNT is disabled.

The address counter 8 is realized by a counter which is generally used in a refresh-related field. The address counter 8 counts the row addresses XADD<1:5> one bit at the time when the counter signal CNT is disabled and output the counted bits of the row addresses XADD<1:5> to the memory core 9.

The memory core 9 includes the first to fourth banks 91 to 94. The memory core 9 activates the first to fourth banks 91 to 94 by the first to fourth bank active signals XACT<1:4>, selects a word line by the row addresses XADD<1:5>, and performs a refresh operation for the memory cells connected with the word line. That is to say, by selecting the word line and sensing and amplifying the data stored in the memory cells connected with the word line, refreshed data are generated and are stored again in the memory cells.

Refresh operations of the semiconductor memory device configured as mentioned above will be described below with reference to FIGS. 2 to 7, by describing three case scenarios: i) a case in which a self-refresh operation is performed by sequentially activating banks; ii) a case in which the self-refresh operation is interrupted in the course of performing the self-refresh operation by sequentially activating the banks; and iii) a case in which an auto-refresh operation is performed by simultaneously activating the banks.

Hereinafter, the case in which a self-refresh operation is performed by sequentially activating banks is described.

The command decoder 2 decodes the command signal CMD and the clock enable signal CKE, and generates the self-refresh signal SREF which is enabled to the logic high level. The self-refresh pulse generation unit 3 generates the self-refresh pulse SREFPB in response to the self-refresh signal SREF. The self-refresh pulse SREFPB includes a pulse which is cyclically generated when performing the self-refresh operation.

The signal generation unit 4 generates the refresh signal REFB and the counter signal CNT which are enabled to logic low levels, at a time T1 in response to the self-refresh pulse SREFPB. The refresh signal REFB is enabled when the self-refresh pulse SREFPB is enabled, and is disabled when the first idle pulse IDLEPB1 is enabled at time T2. The counter signal CNT is enabled when the refresh signal REFB is enabled and is disabled when the second idle pulse IDLEPB2 is enabled at time T3.

The enable signal generation unit 5 sequentially generates the first to fourth enable signals EN<1:4> from the time T1 at which the refresh signal REFB is enabled to the logic low level, in response to the refresh signal REFB and the self-refresh signal SREF. The bank active signal generation unit 6 generates the first to fourth bank active signals XACT<1:4> which are sequentially enabled by the first to fourth enable signals EN<1:4> of the logic high levels. The memory core 9 sequentially activates the first to fourth banks 91 to 94 by the first to fourth bank active signals XACT<1:4>, selects a first word line by the row addresses XADD<1:5> of '00000', and performs the refresh operation for the memory cells connected with the first word line.

The idle pulse generation unit 7 generates the first idle pulse IDLEPB1 at a time T2 when all the first to fourth bank active signals XACT<1:4> are disabled, and generates the second idle pulse IDLEPB2 at a time T3 when the predetermined period elapses from the time when the fourth enable signal EN<4> is enabled. The predetermined period may be longer than the enable period of the fourth bank active signal XACT<4>. The counter signal CNT is disabled at the time T3 when the second idle pulse IDLEPB2 is enabled.

The address counter 8 counts the row address XADD<1:5> of '00000' by one bit at the time T3 when the counter signal CNT is disabled, and outputs the counted bit to the memory core 9. Accordingly, the address counter 8 outputs the row addresses XADD<1:5> of '00001' to the memory core 9.

Hereinafter, the case in which the self-refresh operation is interrupted in the course of performing the self-refresh operation by sequentially activating the banks will be described.

First, the command decoder 2 decodes the command signal CMD and the clock enable signal CKE and generates the self-refresh signal SREF which is enabled to the logic high level. The self-refresh pulse generation unit 3 generates the self-refresh pulse SREFPB in response to the self-refresh signal SREF. The self-refresh pulse SREFPB includes a pulse which is cyclically generated when performing the self-refresh operation.

The signal generation unit 4 generates the refresh signal REFB and the counter signal CNT which are enabled to the logic low levels, at a time T4 in response to the self-refresh pulse SREFPB. The refresh signal REFB is enabled when the self-refresh pulse SREFPB is enabled, and the refresh signal REFB is disabled when the first idle pulse IDLEPB1 is enabled at time T6. The counter signal CNT is enabled when the refresh signal REFB is enabled at time T4, and counter signal CNT is disabled when the second idle pulse IDLEPB2 is enabled at time T9.

The enable signal generation unit 5 sequentially generates the first and second enable signals EN<1:2> from the time T4 at which the refresh signal REFB is enabled to the logic low level, in response to the refresh signal REFB and the self-refresh signal SREF, and the enable signal generation unit 5 outputs the first and second enable signals EN<1:2> to the memory core 9. In this regard, since the self-refresh signal SREF transitions from the logic high level to the logic low level at a time T5, the enable signal generation unit 5 does not generate the third and fourth enable signals EN<3:4>. Accordingly, the bank active signal generation unit 6 generates the first and second bank active signals XACT<1:2> which are sequentially enabled by the first and second enable signals EN<1:2> of the logic high levels and generates the third and fourth bank active signals XACT<3:4> which are disabled. The memory core 9 activates the first and second banks 91 and 92 by the first and second bank active signals XACT<1:2>, selects a second word line by the row addresses XADD<1:5> of '00001', and performs the refresh operation for the memory cells connected with the second word line.

The idle pulse generation unit 7 generates the first idle pulse IDLEPB1 at a time T6 when all the first to fourth bank active signals XACT<1:4> are disabled. However, since the fourth enable signal EN<4> is not generated, the idle pulse generation unit 7 does not generate the second idle pulse IDLEPB2. Since the second idle pulse IDLEPB2 is not enabled, the counter signal CNT is not disabled.

The address counter 8 interrupts a counting operation for the row addresses XADD<1:5> of '00001' since the counter signal CNT is not disabled.

Next, the command decoder 2 decodes the command signal CMD and the clock enable signal CKE and generates the self-refresh signal SREF which is disabled to the logic low level and the auto-refresh pulse AREFPB. The auto-refresh pulse AREFPB includes a pulse which is cyclically generated when performing the auto-refresh operation.

The signal generation unit 4 generates the refresh signal REFB and the counter signal CNT which are enabled to the logic low levels, at a time T7 in response to the auto-refresh pulse AREFPB. The refresh signal REFB is enabled when the self-refresh pulse SREFPB is enabled and is disabled when the first idle pulse IDLEPB1 is enabled. The counter signal CNT is enabled when the refresh signal REFB is enabled and is disabled when the second idle pulse IDLEPB2 is enabled.

The enable signal generation unit 5 simultaneously generates the first to fourth enable signals EN<1:4> at the time T7 at which the refresh signal REFB is enabled, in response to the refresh signal REFB and the self-refresh signal SREF. The bank active signal generation unit 6 generates the first to fourth bank active signals XACT<1:4> which are simultaneously enabled by the first to fourth enable signals EN<1:4> of the logic high levels. The memory core 9 simultaneously activates the first to fourth banks 91 to 94 by the first to fourth bank active signals XACT<1:4>, selects the second word line by the row addresses XADD<1:5> of '00001', and performs the refresh operation for the memory cells connected with the second word line.

The idle pulse generation unit 7 generates the first idle pulse IDLEPB1 at a time T8 when all the first to fourth bank active signals XACT<1:4> are disabled, and generates the second idle pulse IDLEPB2 at a time T9 when the predetermined period elapses from the time when the fourth enable signal EN<4> is enabled. The predetermined period may be longer than the enable period of the fourth bank active signal XACT<4>. At the time T9 when the second idle pulse IDLEPB2 is enabled, the counter signal CNT is disabled.

The address counter 8 counts the row address XADD<1:5> of '00001' by one bit at the time T9 when the counter signal CNT is disabled, and outputs the counted bit to the memory core 9. Accordingly, the address counter 8 outputs the row addresses XADD<1:5> of '00010' to the memory core 9.

Hereinafter, the case in which an auto-refresh operation is performed by simultaneously activating the banks will be described.

The command decoder 2 decodes the command signal CMD and the clock enable signal CKE and generates the self-refresh signal SREF which is disabled to the logic low level and the auto-refresh pulse AREFPB. The auto-refresh pulse AREFPB includes a pulse which is cyclically generated when performing the auto-refresh operation.

The signal generation unit 4 generates the refresh signal REFB and the counter signal CNT which are enabled to the logic low levels, at a time T10 in response to the auto-refresh pulse AREFPB. The refresh signal REFB is enabled when the self-refresh pulse SREFPB is enabled and is disabled when the first idle pulse IDLEPB1 is enabled. The counter signal CNT is enabled when the refresh signal REFB is enabled and is disabled when the second idle pulse IDLEPB2 is enabled.

The enable signal generation unit 5 simultaneously generates the first to fourth enable signals EN<1:4> at the time T10 at which the refresh signal REFB is enabled to the logic low level, in response to the refresh signal REFB and the self-refresh signal SREF. The bank active signal generation unit 6 generates the first to fourth bank active signals XACT<1:4> which are simultaneously enabled by the first to fourth enable signals EN<1:4> of the logic high levels. The memory core 9 simultaneously activates the first to fourth banks 91 to 94 by the first to fourth bank active signals XACT<1:4>, selects a third word line by the row addresses XADD<1:5> of '00010', and performs the refresh operation for the memory cells connected with the third word line.

The idle pulse generation unit 7 generates the first idle pulse IDLEPB1 at a time T11 when all the first to fourth bank active signals XACT<1:4> are disabled, and generates the second idle pulse IDLEPB2 at a time T12 when the predetermined period elapses from the time when the fourth enable signal EN<4> is enabled. The predetermined period may be longer than the enable period of the fourth bank active signal XACT<4>. The counter signal CNT is disabled at the time T12 when the second idle pulse IDLEPB2 is enabled.

The address counter 8 counts the row address XADD<1:5> of '00010' by one bit at the time T12 when the counter signal CNT is disabled, and outputs the counted bit to the memory core 9. Accordingly, the address counter 8 outputs the row addresses XADD<1:5> of '00011' to the memory core 9.

As is apparent from the above descriptions, in the semiconductor memory device in accordance with embodiments of the present invention, when performing a self-refresh operation, the self-refresh operation is performed by sequentially activating first to fourth banks 91 to 94, whereby it is possible to reduce current consumption. Also, in a semiconductor memory device in accordance with an embodiment of the present invention, when a self-refresh operation is interrupted while a certain word line is selected while sequentially activating banks and the self-refresh operation is performed for memory cells connected with the word line, information of the certain word line is stored and an auto-refresh operation is performed from the certain word line in a normal mode, whereby it is possible to perform the refresh operations without omission of a word line. Accordingly, the semiconductor memory device in accordance with the embodiment of the present invention also provides a way of solving problems caused when performing a refresh operation by sequentially activating banks.

Embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A semiconductor memory device comprising:
   a memory core configured to sequentially activate first and second banks in response to first and second bank active signals which are sequentially enabled in response to first and second enable signals when a self-refresh operation is to be performed, select a word line by row addresses, and perform a refresh operation for memory cells which are connected with the word line; and
   an address counter configured to perform a counting operation for the row addresses in response to a counter signal, and interrupt the counting operation for the row addresses in a case where both the first and second banks are not activated when the self-refresh operation is ended.

2. The semiconductor memory device according to claim 1, further comprising a bank active signal generation unit which generates the first and second bank active signal, and wherein the bank active signal generation unit further comprises:
   a pull-up driving section configured to pull-up drive a node in response to first and second precharge signals;
   a pull-down driving section configured to pull-down drive the node in response to the first and second enable signals; and
   a latch section configured to latch a signal of the node.

3. The semiconductor memory device according to claim 2, wherein the bank active signal generation unit further comprises:
   a buffer section configured to buffer an output signal of the latch section and output the first and second bank active signals.

4. The semiconductor memory device according to claim 1, further comprising:
   a signal generation unit configured to generate a refresh signal and the counter signal in response to a self-refresh pulse;
   an enable signal generation unit configured to generate the first and second enable signals in response to the refresh signal and a self-refresh signal; and
   an idle pulse generation unit configured to generate a first idle pulse in response to the first and second bank active signals and generate a second idle pulse in response to the second enable signal.

5. The semiconductor memory device according to claim 4, wherein the refresh signal is enabled in response to the self-refresh pulse and is disabled in response to the first idle pulse.

6. The semiconductor memory device according to claim 4, wherein the counter signal is enabled in response to the refresh signal and is disabled in response to the second idle pulse.

7. The semiconductor memory device according to claim 6, wherein the address counter performs the counting operation at a time when the counter signal is disabled.

8. The semiconductor memory device according to claim 4, wherein the signal generation unit comprises:
   a first latch section configured to receive the self-refresh pulse as a set signal and the first idle pulse as a reset signal and generate the refresh signal; and
   a second latch section configured to receive the refresh signal as a set signal and the second idle pulse as a reset signal and generate the counter signal.

9. The semiconductor memory device according to claim 8, wherein the first and second latch sections receive a power-up signal as a reset signal.

10. The semiconductor memory device according to claim 4, wherein the enable signal generation unit sequentially generates the first and second enable signals when the self-refresh operation is to be performed.

11. The semiconductor memory device according to claim 4, wherein the enable signal generation unit comprises:
   a pulse generating section configured to generate a refresh pulse in response to the refresh signal;
   a control signal generating section configured to generate a control signal in response to the refresh pulse and the self-refresh signal; and
   an output section configured to output the first and second enable signals in response to the refresh pulse, the self-refresh signal and the control signal.

12. The semiconductor memory device according to claim 11, wherein the output section comprises:
   a first output stage configured to buffer the refresh pulse and output the first enable signal;
   a second output stage configured to delay the first enable signal by a predefined period in response to the self-refresh signal and the control signal and output the second enable signal.

13. The semiconductor memory device according to claim 4, wherein the idle pulse generation unit comprises:

a first idle pulse generating section configured to generate the first idle pulse in response to the first and second bank active signals; and a second idle pulse generating section configured to generate the second idle pulse in response to the second enable signal.

14. The semiconductor memory device according to claim 13, wherein the first idle pulse generating section generates the first idle pulse at a time when both the first and second bank active signals are disabled.

15. The semiconductor memory device according to claim 13, wherein the second idle pulse generating section generates the second idle pulse after a predetermined period elapses from a time when the second enable signal is enabled.

16. The semiconductor memory device according to claim 15, wherein the predetermined period is longer than an enable period of the bank active signals.

17. The semiconductor memory device according to claim 13, wherein the second idle pulse generating section generates the second idle pulse after the first idle pulse is generated.

18. A refresh method of a semiconductor memory device, comprising:

performing a self-refresh operation by sequentially activating first and second banks; and performing an auto-refresh operation by simultaneously activating the first and second banks, wherein performing the self-refresh operation is performed in a normal mode, and performing the auto-refresh operation is performed in a power-down mode.

19. The refresh method according to claim 18, wherein performing the self-refresh operation comprises:

activating the first bank, selecting a word line by row addresses, and performing a refresh operation for memory cells which are connected with the word line; and activating the second bank, selecting a word line by the row addresses, and performing a refresh operation for memory cells which are connected with the word line.

20. The refresh method according to claim 19, wherein the activating of the first bank, selecting the word line and performing the refresh operation comprises:

selecting the word line by the row addresses;

generating refreshed data by sensing and amplifying data stored in the memory cells which are connected with the word line; and storing the refreshed data in the memory cells.

21. The refresh method according to claim 19, wherein activating second bank, selecting the word line and performing the refresh operation comprises:

selecting the word line by the row addresses;

generating refreshed data by sensing and amplifying data stored in the memory cells which are connected with the word line; and storing the refreshed data in the memory cells.

* * * * *